US010620763B2

(12) United States Patent
Hsu

(10) Patent No.: US 10,620,763 B2
(45) Date of Patent: Apr. 14, 2020

(54) TOUCH-SENSOR STRUCTURES AND METHODS OF FORMING THE SAME

(71) Applicant: TPK Touch Solutions (Xiamen) Inc., Xiamen (CN)

(72) Inventor: I-Chung Hsu, Taipei (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 64 days.

(21) Appl. No.: 15/960,560

(22) Filed: Apr. 24, 2018

(65) Prior Publication Data

US 2018/0239471 A1   Aug. 23, 2018

Related U.S. Application Data

(62) Division of application No. 14/564,023, filed on Feb. 8, 2014, now Pat. No. 9,983,739.

(30) Foreign Application Priority Data

Dec. 9, 2013   (CN) .......................... 2013 1 0657434

(51) Int. Cl.
*G06F 3/044*   (2006.01)

(52) U.S. Cl.
CPC .... *G06F 3/044* (2013.01); *G06F 2203/04103* (2013.01); *G06F 2203/04111* (2013.01); *H03K 2217/96015* (2013.01)

(58) Field of Classification Search
CPC .......... H03K 2217/96015; G06F 3/044; G06F 2203/04111; G06F 2203/04103
See application file for complete search history.

(56) References Cited

U.S. PATENT DOCUMENTS

2012/0194474 A1* 8/2012 Chang ..................... G06F 3/044
345/174

* cited by examiner

*Primary Examiner* — Charles V Hicks
(74) *Attorney, Agent, or Firm* — Cooper Legal Group, LLC

(57) ABSTRACT

A touch-sensor structure includes a first conductive layer, a second conductive layer, insulating isolation portions, and an intermediate conductive layer. The first conductive layer includes first conductive units, connection lines and second conductive units. Each connection line connects to two first conductive units. The second conductive layer includes bridge lines. Each bridge line is electrically connected to two second conductive units. The insulating isolation portion is disposed between the connection line and the bridge line. The intermediate conductive layer is at least disposed at an overlapping position between the bridge lines and the second conductive units to isolate the first conductive layer from the second conductive layer. The intermediate conductive layer electrically connects each bridge line to the corresponding second conductive units.

20 Claims, 13 Drawing Sheets

TOUCH-SENSOR STRUCTURES AND METHODS OF FORMING THE SAME

CROSS-REFERENCES TO RELATED APPLICATIONS

This application is a divisional of and claims priority to U.S. patent application Ser. No. 14/564,023, titled "Touch-sensor structures and methods of forming the same", filed on Dec. 8, 2014, now pending, which claims priority to Chinese Application Serial Number 201310657434.4, filed on Dec. 9, 2013, which is herein incorporated by reference.

BACKGROUND OF THE INVENTION

Field of the Invention

The disclosure relates to touch device technology, and in particular, to touch-sensor structures and methods of forming the same.

Description of the Related Art

Recently, touch panel techniques have been developed to be a main input method and have been popularly applied in various electronic products, such as mobile phones, personal digital assistants (PDA), and handheld personal computers. Touch sensors of a touch panel are usually formed from a first indium tin oxide (ITO) layer and a second ITO layer. The first ITO layer forms a plurality of sensing-electrode patterns connecting with each other and arranged to form a plurality of columns, and a plurality of sensing-electrode patterns separated from each other and arranged to form a plurality of rows. The second ITO layer forms jumpers for electrically connecting the sensing-electrode patterns separated from each other and arranged in the rows.

The jumpers from the second ITO layer are usually formed by an etching process. However, if the first and second ITO layers are formed from the same material, an etching solution for etching the second ITO layer will also damage the first ITO layer. Thus, the first ITO layer is made of a crystalline indium tin oxide and the second ITO layer is made of a non-crystalline indium tin oxide. Next, an etching solution, which can only etch the non-crystalline indium tin oxide and cannot etch the crystalline indium tin oxide, is used to etch the non-crystalline indium tin oxide of the second ITO layer to avoid damaging the first ITO layer.

BRIEF SUMMARY OF THE INVENTION

The second ITO layer made of the non-crystalline indium tin oxide easily produces a re-crystalline phenomenon during the fabrication processes of conventional touch panels. The etching solution cannot completely etch the second ITO layer to form the required pattern. It causes a short or open issue to occur between the sensing-electrode patterns of the touch sensors. The touch-sensing function of conventional touch panels is often poor, or fails altogether. The disclosure provides touch-sensor structures and methods of forming the same to overcome the aforementioned problems associated with conventional touch panels. According to embodiments of the disclosure, an intermediate conductive layer is disposed between a first conductive layer and a second conductive layer of touch sensors, such that the second conductive layer is not recrystallized. Therefore, it can prevent the second conductive layer from an incomplete etching.

According to some embodiments of the disclosure, a touch-sensor structure is provided. The touch-sensor structure comprises a first conductive layer including a plurality of first conductive units arranged along a first axis, a plurality of connection lines, and a plurality of second conductive units arranged along a second axis, wherein the second conductive units are correspondingly disposed at two opposite sides of each connection line, and the two ends of each connection line are connected to two adjacent first conductive units. The touch-sensor structure also comprises a second conductive layer including a plurality of bridge lines, wherein the two ends of each bridge line are respectively electrically connected to the second conductive units disposed at the two opposite sides of each connection line. The touch-sensor structure further comprises a plurality of insulating isolation portions respectively disposed between each of the connection lines and each of the bridge lines, which correspond with each other, for insulating the first conductive units from the second conductive units. In addition, the touch-sensor structure comprises an intermediate conductive layer at least disposed at overlapping positions between the bridge lines and the second conductive units to isolate the first conductive layer from the second conductive layer without coming into direct contact, wherein the intermediate conductive layer has conductivity and electrically connects each of the bridge lines with the corresponding second conductive units.

In some embodiments, the touch-sensor structure further comprises a substrate. The first conductive layer is disposed on the substrate. The material of the first conductive layer is a crystalline indium tin oxide and the material of the second conductive layer is a non-crystalline indium tin oxide.

In some embodiments, the intermediate conductive layer is further disposed on the first conductive units, the connection lines and the second conductive units. The intermediate conductive layer has a pattern corresponding to the pattern of the first conductive units, the connection lines and the second conductive units.

In some embodiments, the first conductive layer includes a first region and a second region. The first region is a region of the first conductive layer overlapping the insulating isolation portions. The second region is a region of the first conductive layer that does not overlap the insulating isolation portions. The intermediate conductive layer is further disposed in the second region of the first conductive layer and directly contacts with the first conductive layer. The intermediate conductive layer has a pattern corresponding to and overlapped with the pattern of the first conductive layer in the second region.

In some embodiments, the intermediate conductive layer is further disposed between each of the bridge lines and each of the insulating isolation portions, which correspond with each other. The intermediate conductive layer has a pattern corresponding to the pattern of the bridge lines.

In some embodiments, the touch-sensor structure further comprises a substrate. The second conductive layer is disposed on the substrate. The material of the second conductive layer is a crystalline indium tin oxide and the material of the first conductive layer is a non-crystalline indium tin oxide.

In some embodiments, the intermediate conductive layer is disposed at the overlapping positions between the bridge lines and the second conductive units. In addition, the intermediate conductive layer wraps the outer sides of the bridge lines.

In some embodiments, the intermediate conductive layer is further disposed between each of the connection lines and each of the insulating isolation portions, which correspond with each other. The intermediate conductive layer is also disposed between the first conductive units, the second conductive units and the substrate. In addition, the intermediate conductive layer has a pattern corresponding to the pattern of the first conductive units, the connection lines and the second conductive units.

In some embodiments, the material of the intermediate conductive layer is made of a transparent conductive material. The transparent conductive material is selected from a group consisting of tin oxide, zinc oxide, aluminum doped zinc oxide, zinc gallium oxide, indium zinc oxide, indium gallium zinc oxide and indium tungsten oxide.

According to some embodiments of the disclosure, a method of forming a touch-sensor structure is provided. The method comprises the step of forming a first conductive layer. The first conductive layer includes a plurality of first conductive units arranged along a first axis, a plurality of connection lines, and a plurality of second conductive units arranged along a second axis. The second conductive units are correspondingly disposed at two opposite sides of each connection line, and the two ends of each connection line are connected to two adjacent first conductive units. The method also comprises the step of forming a second conductive layer. The second conductive layer includes a plurality of bridge lines. The two ends of each bridge line are respectively electrically connected to the second conductive units disposed at the two opposite sides of each connection line. The method further comprises the step of forming a plurality of insulating isolation portions. The insulating isolation portions are respectively disposed between each of the connection lines and each of the bridge lines, which correspond with each other, for insulating the first conductive units from the second conductive units. Before forming the insulating isolation portions, the method further comprises the step of forming an intermediate conductive material layer to completely cover the first conductive layer or the second conductive layer for isolating the first conductive layer from the second conductive layer without coming into direct contact. In addition, the method comprises the step of patterning the intermediate conductive material layer to from an intermediate conductive layer. The intermediate conductive layer is at least located in overlapping positions between the bridge lines and the second conductive units. The intermediate conductive layer has conductivity and electrically connects each of the bridge lines with the corresponding second conductive units.

According to some embodiments of the disclosure, a method of forming a touch-sensor structure is provided. The method comprises the step of forming a first conductive layer. The first conductive layer includes a plurality of first conductive units arranged along a first axis, a plurality of connection lines, and a plurality of second conductive units arranged along a second axis. The second conductive units are correspondingly disposed at two opposite sides of each connection line, and the two ends of each connection line are connected to two adjacent first conductive units. The method also comprises the step of forming a second conductive layer. The second conductive layer includes a plurality of bridge lines. The two ends of each bridge line are respectively electrically connected to the second conductive units disposed at the two opposite sides of each connection line. The method further comprises the step of forming a plurality of insulating isolation portions. The insulating isolation portions are respectively disposed between each of the connection lines and each of the bridge lines, which correspond with each other, for insulating the first conductive units from the second conductive units. After forming the insulating isolation portions, the method further comprises the step of forming an intermediate conductive material layer to partially cover the first conductive layer or the second conductive layer. The areas of the intermediate conductive material layer and the insulating isolation portions are enough to isolate the first conductive layer from the second conductive layer without coming into direct contact. In addition, the method comprises the step of patterning the intermediate conductive material layer to from an intermediate conductive layer. The intermediate conductive layer is at least located in overlapping positions between the bridge lines and the second conductive units. The intermediate conductive layer has conductivity and electrically connects each of the bridge lines with the corresponding second conductive units.

In some embodiments, the first conductive layer is directly formed on a substrate. The intermediate conductive material layer covers the first conductive layer. The material of the first conductive layer is a crystalline indium tin oxide and the material of the second conductive layer is a non-crystalline indium tin oxide.

In some embodiments, the step of forming the second conductive layer includes patterning a second conductive material layer to form the second conductive layer. The step of patterning the second conductive material layer is performed with the step of patterning the intermediate conductive material layer together in the same step.

In some embodiments, the second conductive layer is directly formed on a substrate. The intermediate conductive material layer covers the second conductive layer. The material of the second conductive layer is a crystalline indium tin oxide and the material of the first conductive layer is a non-crystalline indium tin oxide.

In some embodiments, the step of forming the first conductive layer includes patterning a first conductive material layer to form the first conductive layer. The step of patterning the first conductive material layer is performed with the step of patterning the intermediate conductive material layer together in the same step.

The embodiments of the disclosure can prevent the second conductive layer of the touch-sensor structures from re-crystallization which is produced by the effect of the first conductive layer. Thus, issues such as failure and poor result in the etching of the second conductive layer are overcome. It can avoid a short-circuit of the touch-sensor structures to ensure the touch-sensing function. Therefore, the product yield of the touch panels is enhanced.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE DISCLOSURES

The following description is of the best-contemplated mode of carrying out the disclosure. This description is made for the purpose of illustrating the general principles of the disclosure and should not be taken in a limiting sense.

In the descriptions that follow, the orientations of "on", "over", "above", "under" and "below" are used for representing the relationship between the relative positions of each element in the touch-sensor structures, and are not used to limit the disclosure.

In the accompanying drawings, in order to clearly illustrate the characteristics of embodiments of the disclosure, each element in the touch-sensor structures may not be drawn to scale. Moreover, the embodiments of the touch-sensor structures and the methods of forming the same are described in an orientation in which the substrate is disposed at the bottom. However, in at least some touch panel applications, the touch-sensor structures are provided for users in an orientation in which the substrate is disposed at the top of touch panels.

Figure 1:
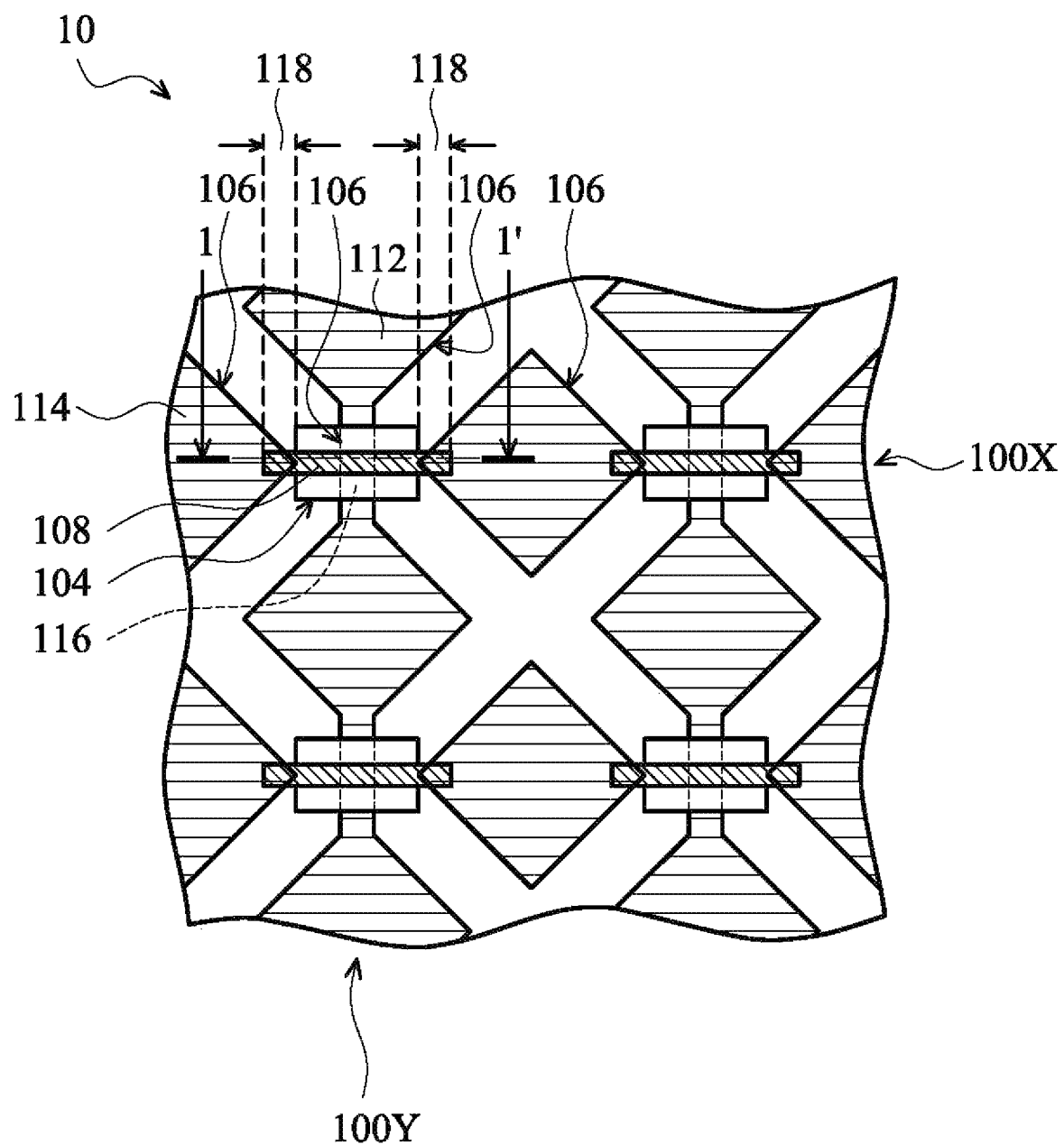
FIG. 1 shows an illustrative plane view of a part of a touch-sensor structure according to an embodiment of the disclosure.

Referring to FIG. 1, a plane view of a part of a touch-sensor structure 10 of a touch panel according to one or more embodiments is shown. The touch-sensor structure 10 includes a first conductive layer 110 (see, for example, FIG. 2), a second conductive layer 120, a plurality of insulating isolation portions 104 and an intermediate conductive layer 106.

The first conductive layer 110 includes a plurality of first conductive units 112 arranged along a first axis, a plurality of connection lines 116, and a plurality of second conductive units 114 arranged along a second axis. The second axis is substantially perpendicular to the first axis. There are two second conductive units 114 correspondingly disposed at two opposite sides of each connection line 116. The two ends of each connection line 116 are connected to two adjacent first conductive units 112.

The second conductive layer 120 includes a plurality of bridge lines 108. The two ends of each bridge line 108 are respectively electrically connected to the second conductive units 114 disposed at the two opposite sides of each connection lines 116.

The first conductive units 112 and the connection lines 116 constitute a plurality of first axial electrodes 100Y. The second conductive units 114 and the bridge lines 108 constitute a plurality of second axial electrodes 100X.

The insulating isolation portions 104 are respectively disposed between each of the connection lines 116 and each of the bridge lines 108 for insulating the first conductive units 112 from the second conductive units 114. The insulating isolation portions 104 prevents a short circuiting at the intersections of the first axial electrodes 100Y and the second axial electrodes 100X. The insulating isolation portions 104 are formed from a transparent insulating material. In some embodiments, the transparent insulating material is an inorganic material, such as silicon nitride, silicon oxide and silicon oxynitride, or an organic material, such as acrylic resin, or other suitable materials.

The intermediate conductive layer 106 is at least disposed at overlapping positions 118 between the bridge lines 108 and the second conductive units 114 to isolate the first conductive layer 110 from the second conductive layer 120. The intermediate conductive layer 106 has conductivity and electrically connects each of the bridge lines 108 with the corresponding second conductive units 114. The intermediate conductive layer 106 can be formed from a transparent conductive material. In some embodiments, the transparent conductive material is tin oxide, zinc oxide, aluminum doped zinc oxide, zinc gallium oxide, indium zinc oxide, indium gallium zinc oxide or indium tungsten oxide, or a combination thereof.

Various embodiments of touch-sensor structures are illustrated in the cross sections of FIGS. 2-13C. The positions of the intermediate conductive layer 106 in various embodiments will be described in detail as follows.

Figure 2:
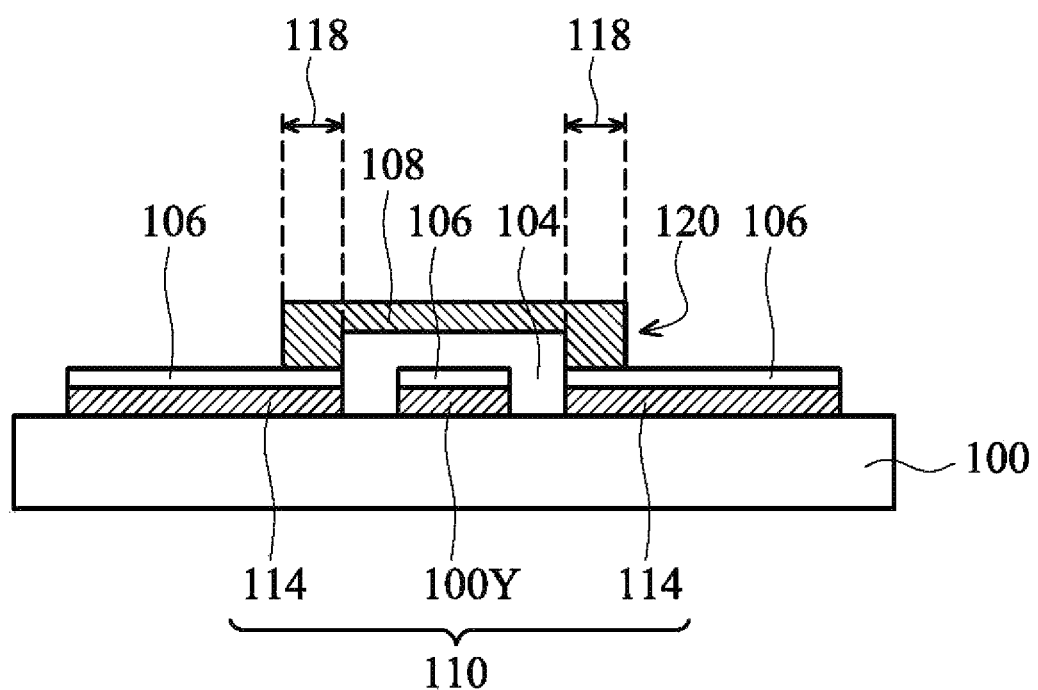
FIGS. 2, 4, 6, 8, 10 and 12 show illustrative cross sections of touch-sensor structures according to some embodiments of the disclosure.
Figure 4:
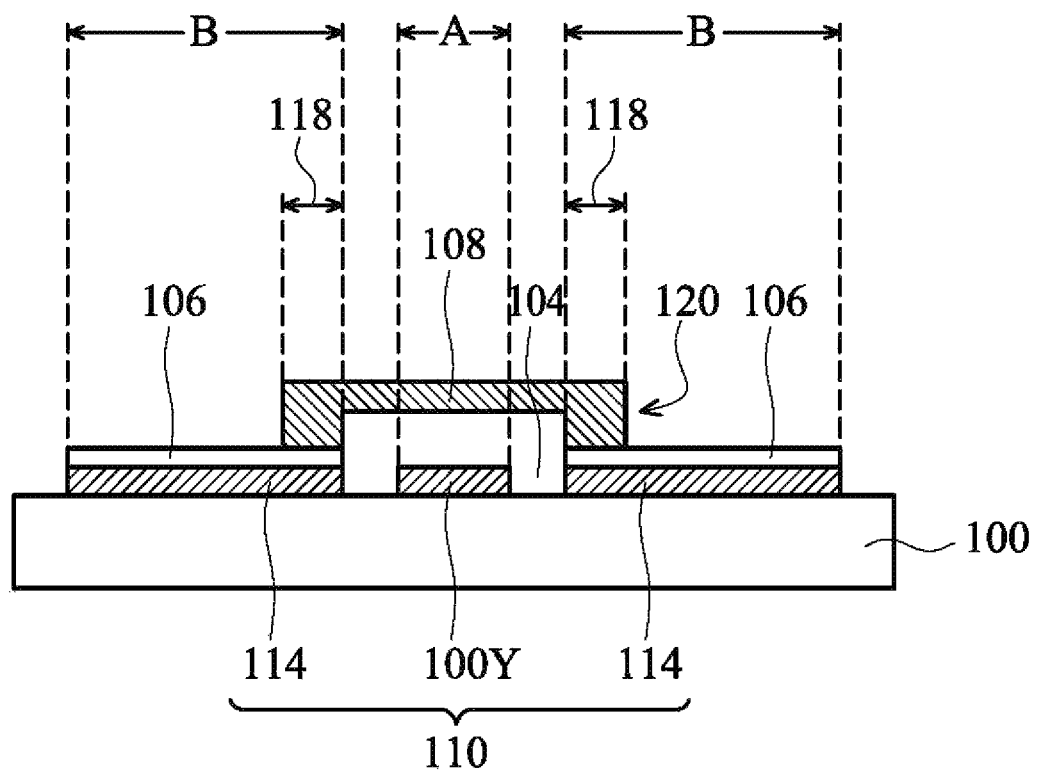
Figure 6:
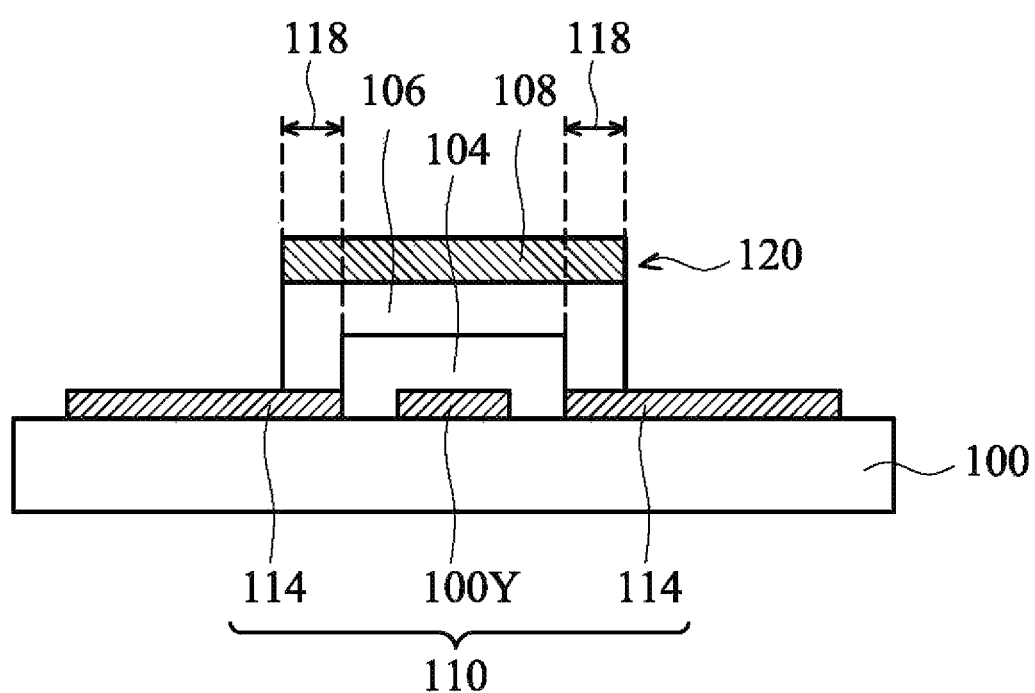

In embodiments of touch-sensor structures shown in FIGS. 2, 4 and 6, the touch-sensor structures further comprise a substrate 100. The substrate 100 can be used as a carrier. Moreover, the substrate 100 can be used as a cover plate of a touch panel, which can be a strengthening glass substrate or a plastic substrate. The first conductive layer 110 is formed on the substrate 100. In addition, the material of the first conductive layer 110 can be a crystalline indium tin oxide and the material of the second conductive layer 120 can be a non-crystalline indium tin oxide.

Referring to FIG. 2, a cross section of a touch-sensor structure according to one or more embodiments of the disclosure is shown.

The first conductive units 112 and the connection lines 116 of the first axial electrodes 100Y, and the second conductive units 114 of the second axial electrodes 100X (see, for example, FIG. 1) are includes in the first conductive layer 110 The connections and the functions of the elements of the first conductive layer 110 are described above, and are not repeated again.

Description of the connections and the functions of the intermediate conductive layer 106 is provided in the description of FIG. 1. In some embodiments, the intermediate conductive layer 106 is disposed on the first conductive units 112, the connection lines 116 and the second conductive units 114 of the first conductive layer 110. Moreover, the intermediate conductive layer 106 corresponds to the pattern of the first conductive units 112, the connection lines 116 and the second conductive units 114. In some embodiments, the intermediate conductive layer 106 corresponds to, and has substantially the same pattern as, the first conductive units 112, the connection lines 116 and the second conductive units 114.

Description of the connections and the functions of the insulating isolation portions 104 is provided in the description of FIG. 1. In some embodiments, the insulating isolation portions 104 are disposed on the intermediate conductive layer 106 between each of the connection lines 116 and each of the bridge lines 108.

The second conductive layer 120 includes the bridge lines 108. The connections and the functions of the bridge lines 108 can also be illustrated in the description of FIG. 1. In some embodiments, the second conductive layer 120 is further disposed on the insulating isolation portions 104 to respectively electrically connect with the second conductive units 114 disposed at the two opposite sides of each connection line 116.

The connections and the functions of each element, and the material and the method of forming each element are described in the description of FIG. 1, and are not repeated again herein.

Figure 3A:
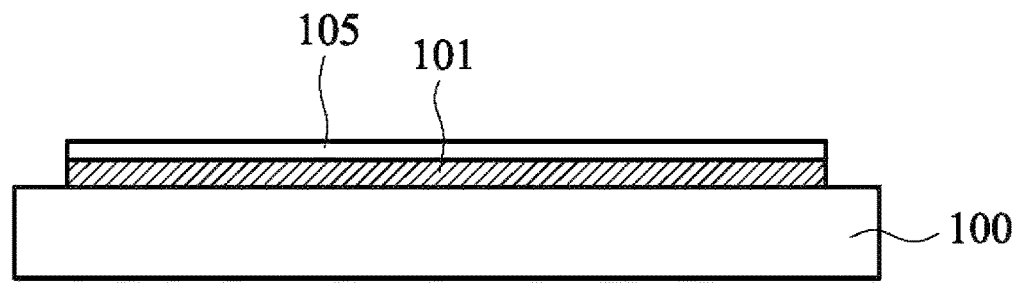
FIGS. 3A-3C show illustrative cross sections of intermediate stages of forming the touch-sensor structure of FIG. 2 according to an embodiment of the invention.
Figure 3B:
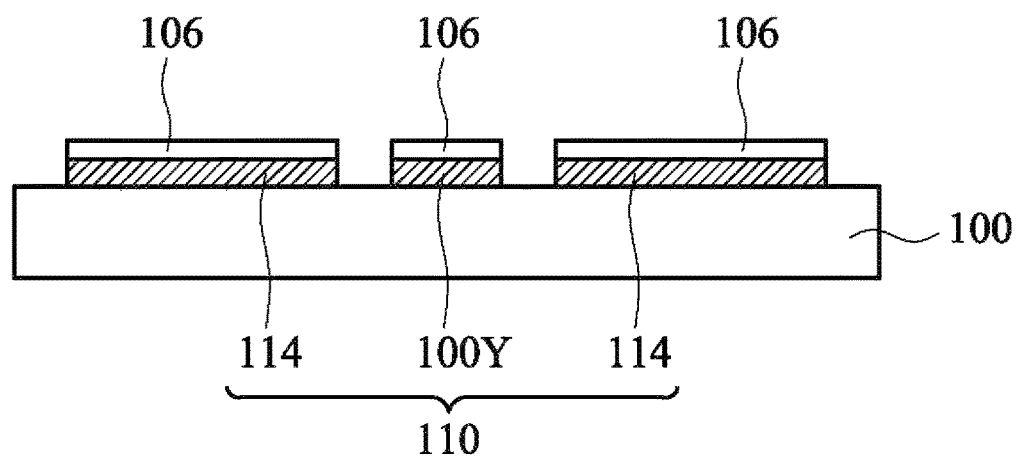
Figure 3C:
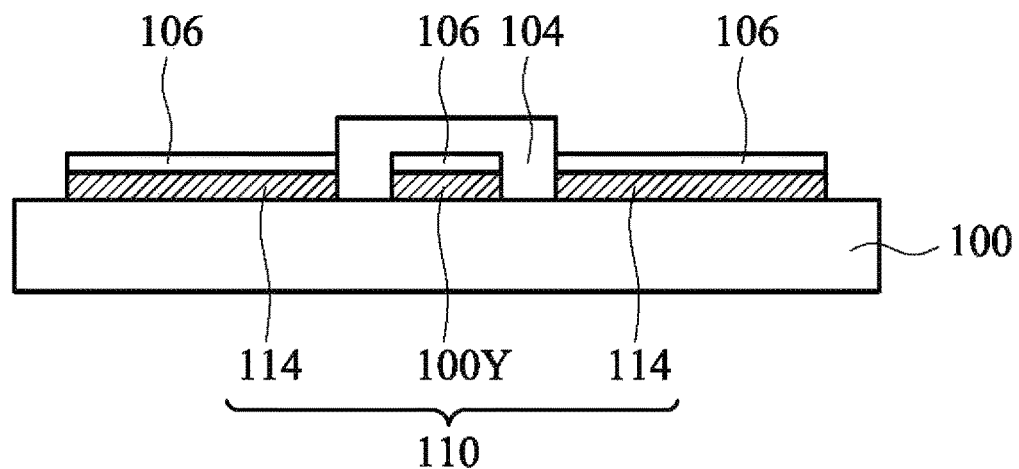

FIGS. 3A-3C show cross sections of intermediate stages of forming the touch-sensor structure of FIG. 2 according to at least one embodiment of the disclosure. As shown in FIG. 3A, a first conductive material layer 101 is formed on the substrate 100. The material of the first conductive material layer 101 is a crystalline indium tin oxide. Next, an intermediate conductive material layer 105 is formed to completely cover the first conductive material layer 101. The first conductive material layer 101 includes the subsequently patterned first conductive layer 110. The intermediate conductive material layer 105 completely covers the first conductive layer 110 herein. In some embodiments, the material of the intermediate conductive material layer 105 is selected from tin oxide, zinc oxide, aluminum doped zinc oxide, zinc gallium oxide, indium zinc oxide, indium gallium zinc oxide and indium tungsten oxide or a combination thereof. The first conductive material layer 101 and the intermediate conductive material layer 105 can be formed by, for example deposition processes, but embodiments including other suitable processes are also contemplated herein.

A step for patterning the first conductive material layer 101 and a step for patterning the intermediate conductive material layer 105 are performed together in the same step for forming the patterns of the first conductive layer 110 and the intermediate conductive layer 106 as shown in FIG. 3B. The structures and the connections of the first conductive layer 110 and the intermediate conductive layer 106 are described in the description of FIG. 2. The intermediate conductive layer 106 has a pattern corresponding to, or the same as, the pattern of the first conductive units 112, the connection lines 116 and the second conductive units 114 of the first conductive layer 110. In some embodiments, the steps for patterning the first conductive material layer 101 and the intermediate conductive material layer 105 are completed by, a photolithography and etching process, but without limitation to that. In other embodiments, the first conductive layer 110 and the intermediate conductive layer 106 can be formed in separated steps. Firstly, the patterned first conductive layer 110 is formed, and then the intermediate conductive material layer 105 is formed on the first conductive layer 110. Next, the intermediate conductive material layer 105 is patterned to form the intermediate conductive layer 106. The formed intermediate conductive layer 106 has a pattern that corresponds to, or is the same as, the pattern of the first conductive layer 110.

As shown in FIG. 3C, the insulating isolation portions 104 as described in FIG. 2 are formed on the intermediate conductive layer 106 and correspond to the connection lines of the first conductive layer 110. The insulating isolation portions 104 can be formed by a coating, photolithography and etching process, or by a printing process.

A second conductive material layer is formed on the insulating isolation portions 104, and the second conductive material layer is patterned to form the second conductive layer 120 including the bridge lines 108. The material of the second conductive layer 120 is a non-crystalline indium tin oxide. In some embodiments, the second conductive material layer is deposited by, but without limitation to, a low-temperature deposition process. In some embodiments, the second conductive material layer is patterned by, but without limitation to, a photolithography and etching process to obtain the second conductive layer 120 including the bridge lines 108 as shown in FIG. 2. In some embodiments, the etching process described above is performed by using an oxalic acid solution to form the bridge lines 108. Then, the main structure of the touch-sensor structure of FIG. 2 is completed.

In some embodiments, before the insulating isolation portions 104 are formed, both the formed intermediate conductive material layer 105 and the subsequently patterned intermediate conductive layer 106 completely cover the first conductive layer 110 to isolate the first conductive layer 110 from the subsequently formed second conductive layer 120 without coming into direct contact between the first and second conductive layers 110 and 120. Thus, there is no crystallization produced between the first conductive layer 110 and the subsequently formed second conductive layer 120.

Referring to FIG. 4, a cross section of a touch-sensor structure according to an embodiment of the disclosure is shown.

The first conductive layer 110 includes the first conductive units 112 and the connection lines 116 which constitute the first axial electrodes 100Y, and the second conductive units 114 of the second axial electrodes 100X as shown in FIG. 1. The connections and the functions of the elements of the first conductive layer 110 are described above, and are not repeated again. In some embodiments, the first conductive layer 110 is divided into a first region A and a second region B. The first region A is a region of the first conductive layer 110 overlapping the insulating isolation portions 104. The second region B is a region of the first conductive layer 110 that does not overlap the insulating isolation portions 104. In some embodiments, the intermediate conductive layer 106 is not disposed in the first region A. The intermediate conductive layer 106 is disposed in the second region B of the first conductive layer 110 and directly contacts with the first conductive layer 110. The intermediate conductive layer 106 has a pattern corresponding to and overlapping with the pattern of the first conductive layer 110 in the second region B. In some embodiments, the intermediate conductive layer 106 has a pattern that is the same as, and consistent with, the pattern of the first conductive layer 110 in the second region B.

The connections and the functions of the insulating isolation portions 104 can also be illustrated in the description of FIG. 1. In some embodiments, the insulating isolation portions 104 are respectively disposed on each of the connection lines 116.

The second conductive layer 120 includes the bridge lines 108. The connections and the functions of the bridge lines 108 are described in the description of FIG. 1. In some embodiments, the second conductive layer 120 is further disposed on the insulating isolation portions 104 to respectively electrically connect with the second conductive units 114 disposed at the two opposite sides of each connection line 116.

In addition, the connections and the functions of each element, and the material and the method of forming each element are described in the description of FIG. 1, and are not repeated again herein.

Figure 5A:
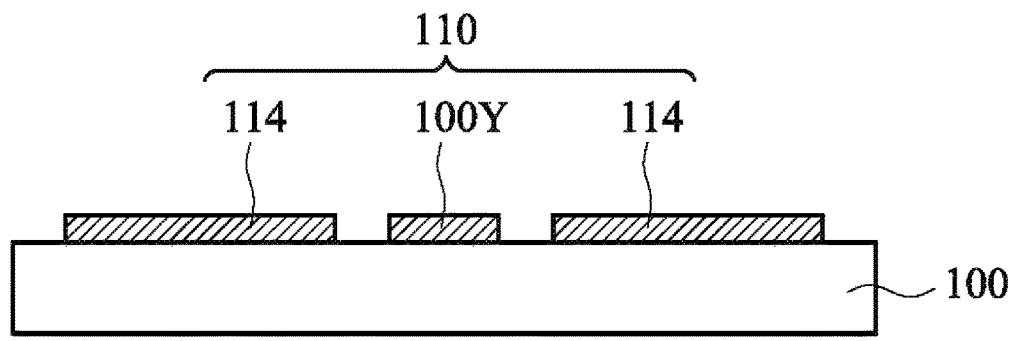
FIGS. 5A-5C show illustrative cross sections of intermediate stages of forming the touch-sensor structure of FIG. 4 according to an embodiment of the invention.
Figure 5B:
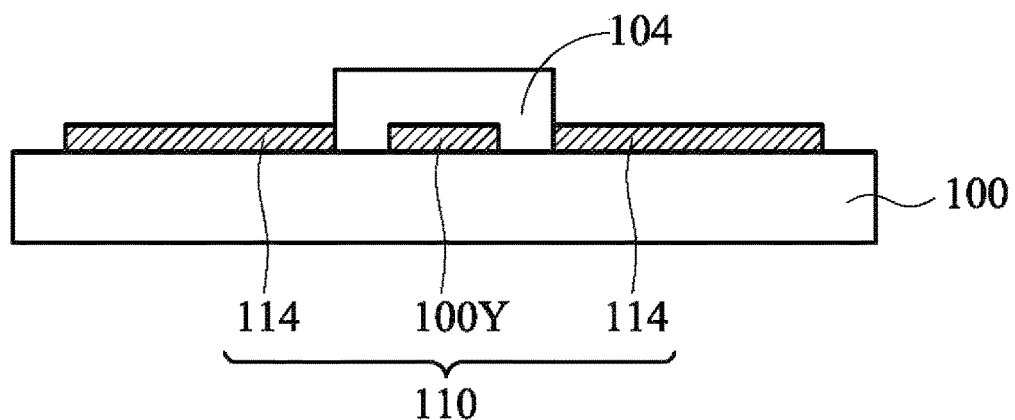
Figure 5C:
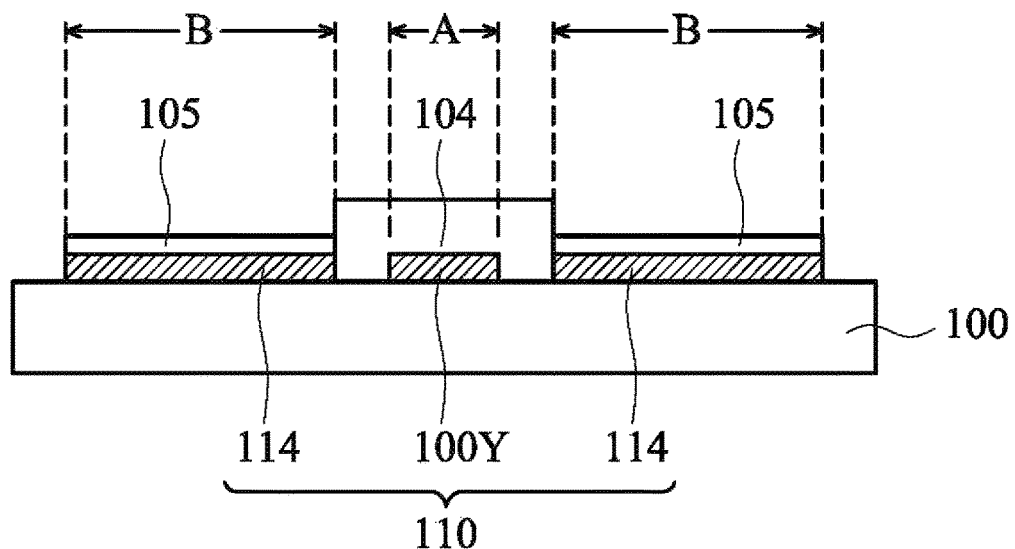

FIGS. 5A-5C show cross sections of intermediate stages of forming the touch-sensor structure of FIG. 4 according to one or more embodiments of the disclosure. As shown in FIG. 5A, first, a pattern of the first conductive layer 110 as shown in FIG. 4 is formed on the substrate 100. The first conductive layer 110 can be formed by a deposition, photolithography and etching process. The material of the first conductive layer 110 is a crystalline indium tin oxide. A first conductive material layer is deposited on the substrate 100, and the first conductive material layer is patterned by a photolithography and etching process to form the first conductive layer 110. The pattern of the first conductive layer 110 can also be formed by other methods in one step, for example by a printing process.

As shown in FIG. 5B, the insulating isolation portions 104 as described in FIG. 4 are formed over the connection lines of the first conductive layer 110. The insulating isolation portions 104 can be formed by a coating, photolithography and etching process, or by a printing process.

As shown in FIG. 5C, after the insulating isolation portions 104 are formed, an intermediate conductive material layer 105 is formed by, but without limitation to, a deposition process to cover a portion of the first conductive layer 110. The material of the intermediate conductive material layer 105 is the same as in the above description, and to simplify the description it is not repeated again herein. In some embodiments, the intermediate conductive material layer 105 is patterned by, but without limitation to, a photolithography and etching process to form the intermediate conductive layer 106 as shown in FIG. 4. In some embodiments, the intermediate conductive layer 106 is formed in the second region B which is the region of the first conductive layer 110 that does not overlap the insulating isolation portions 104. In the second region B, the intermediate conductive layer 106 directly contacts with the first conductive layer 110. Moreover, the intermediate conductive layer 106 has a pattern corresponding to and overlapped with the pattern of the first conductive layer 110 in the second region B. The areas of forming the intermediate conductive material layer 105 (or even the patterned intermediate conductive layer 106) and the insulating isolation portions 104 are enough to isolate the first conductive layer 110 from the subsequently formed second conductive layer 120 without coming into direct contact therebetween. Thus, the probability of crystallization occurring at the second conductive layer 120 is reduced.

A second conductive material layer is formed on the insulating isolation portions 104, and the second conductive material layer is patterned to form the second conductive layer 120 including the bridge lines 108. The material of the second conductive layer 120 is a non-crystalline indium tin oxide. In some embodiments, the second conductive material layer is deposited by, but without limitation to, a low-temperature deposition process. In some embodiments, the second conductive material layer is patterned by, but without limitation to, a photolithography and etching process to obtain the second conductive layer 120 including the bridge lines 108 as shown in FIG. 4. In some embodiments, the etching process described above is performed by using an oxalic acid solution to form the bridge lines 108. Then, the main structure of the touch-sensor structure of FIG. 4 is completed.

Referring to FIG. 6, a cross section of a touch-sensor structure according to one or more embodiments of the disclosure is shown.

The first conductive layer 110 includes the first conductive units 112 and the connection lines 116 which constitute the first axial electrodes 100Y, and the second conductive units 114 of the second axial electrodes 100X as shown in FIG. 1. The connections and the functions of the elements of the first conductive layer 110 are described above, and the description is not repeated again here.

The connections and the functions of the intermediate conductive layer 106 are described in the description of FIG. 1. In some embodiments, the intermediate conductive layer 106 is further disposed between each of the bridge lines 108 and each of the insulating isolation portions 104, which correspond with each other. The intermediate conductive layer 106 has a pattern corresponding to or the same as the pattern of the bridge lines 108.

The connections and the functions of the insulating isolation portions 104 are described in the description of FIG. 1. In some embodiments, the insulating isolation portions 104 are disposed on each of the connection lines 116, but do not completely cover the connection lines 116. In some embodiments, the two ends of each connection line 116 are connected to two adjacent first conductive units 112.

The second conductive layer 120 includes the bridge lines 108. The connections and the functions of the bridge lines 108 can also be illustrated in the description of FIG. 1. In some embodiments, the second conductive layer 120 is further disposed on the intermediate conductive layer 106 to respectively electrically connect with the second conductive units 114 disposed at the two opposite sides of each connection line 116.

In addition, the connections and the functions of each element, and the material and the method of forming each element can also be illustrated in the description of FIG. 1, and are not repeated again herein.

Figure 7A:
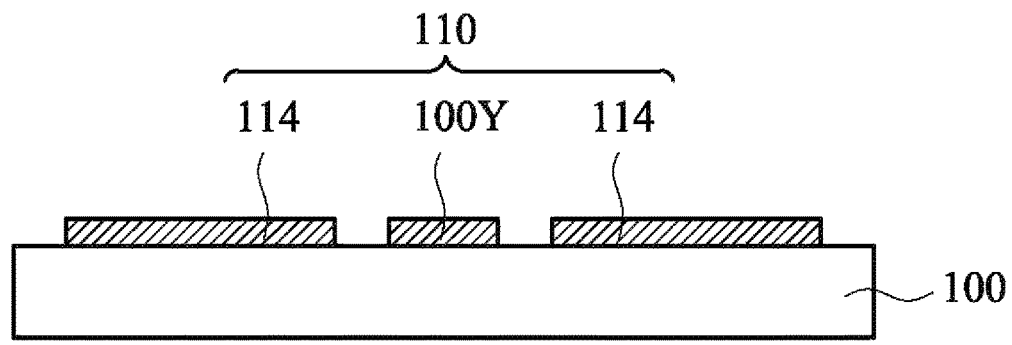
FIGS. 7A-7C show illustrative cross sections of intermediate stages of forming the touch-sensor structure of FIG. 6 according to an embodiment of the invention.
Figure 7B:
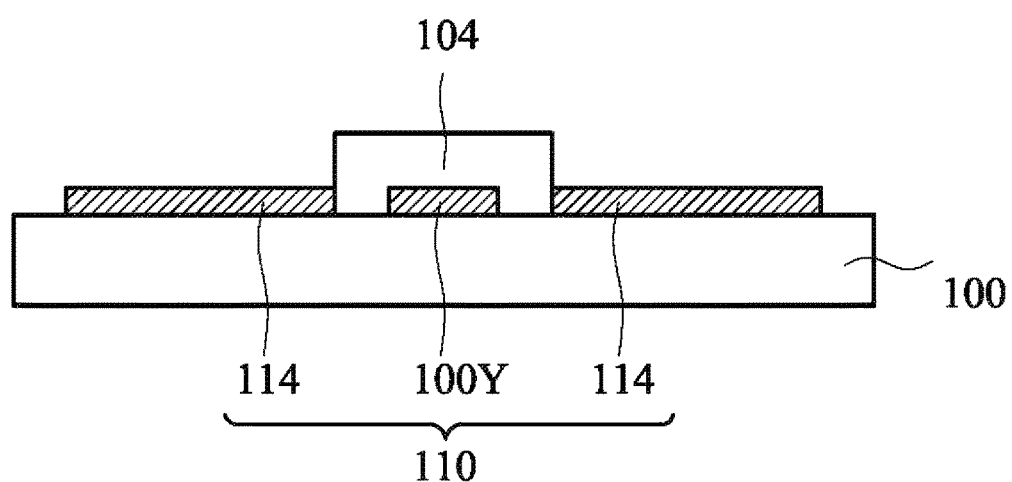
Figure 7C:
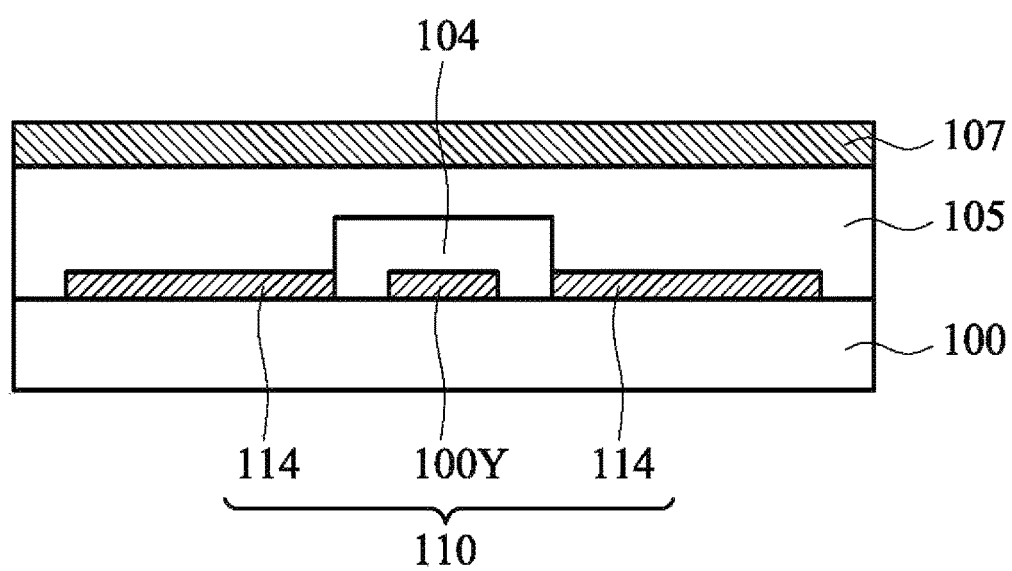

Referring to FIGS. 7A-7C, which shows cross sections of intermediate stages of forming the touch-sensor structure of FIG. 6 according to an embodiment of the disclosure. As shown in FIG. 7A, a pattern of the first conductive layer 110 as shown in FIG. 6 is formed on the substrate 100. The first conductive layer 110 can be formed by a deposition, photolithography and etching process. The material of the first conductive layer 110 is a crystalline indium tin oxide. A first conductive material layer is firstly deposited on the substrate 100 and then the first conductive material layer is patterned by a photolithography and etching process to form the first conductive layer 110. The pattern of the first conductive layer 110 can also be formed by other methods in one step, for example by a printing process.

As shown in FIG. 7B, the insulating isolation portions 104 as described in FIG. 6 are formed over the connection lines of the first conductive layer 110. The insulating isolation portions 104 can be formed by a coating, photolithography and etching process, or by a printing process.

As shown in FIG. 7C, after the insulating isolation portions 104 are formed, an intermediate conductive material layer 105 is formed by, but without limitation to, a deposition process to cover a portion of the first conductive layer 110 and all of the insulating isolation portions 104. The material of the intermediate conductive material layer 105 is the same as in the above description and is not repeated again herein to simplify the description. Next, a second conductive material layer 107 is formed on the intermediate conductive material layer 105. The material of the second conductive material layer 107 is a non-crystalline indium tin oxide. In some embodiments, the second conductive material layer 107 is deposited by, but without limitation to, a low-temperature deposition process. The intermediate conductive material layer 105 is enough to isolate the first conductive layer 110 from the subsequently formed second conductive layer 120 without coming into direct contact therebetween. Thus, it can prevent the second conductive layer 120 from being affected by the first conductive layer 110 and crystallization in the second conductive layer 120. A poor etching issue of the second conductive layer 120 is thereby prevented.

In some embodiments, the steps for patterning the second conductive material layer 107 and the intermediate conductive material layer 105 are performed by, but without limitation to, a photolithography and etching process, and in the same step or in separated steps for forming the second conductive layer 120 including the bridge lines 108 and the intermediate conductive layer 106, respectively, as shown in FIG. 6. As a result, the intermediate conductive layer 106 has a pattern corresponding to or the same as the pattern of the subsequently formed bridge lines 108. The intermediate conductive layer 106 is formed between each of the bridge lines 108 and each of the insulating isolation portions 104, which correspond with each other. The etching process described above can be performed by using an oxalic acid solution to form the bridge lines 108. Then, the main structure of the touch-sensor structure of FIG. 6 is completed.

Figure 8:
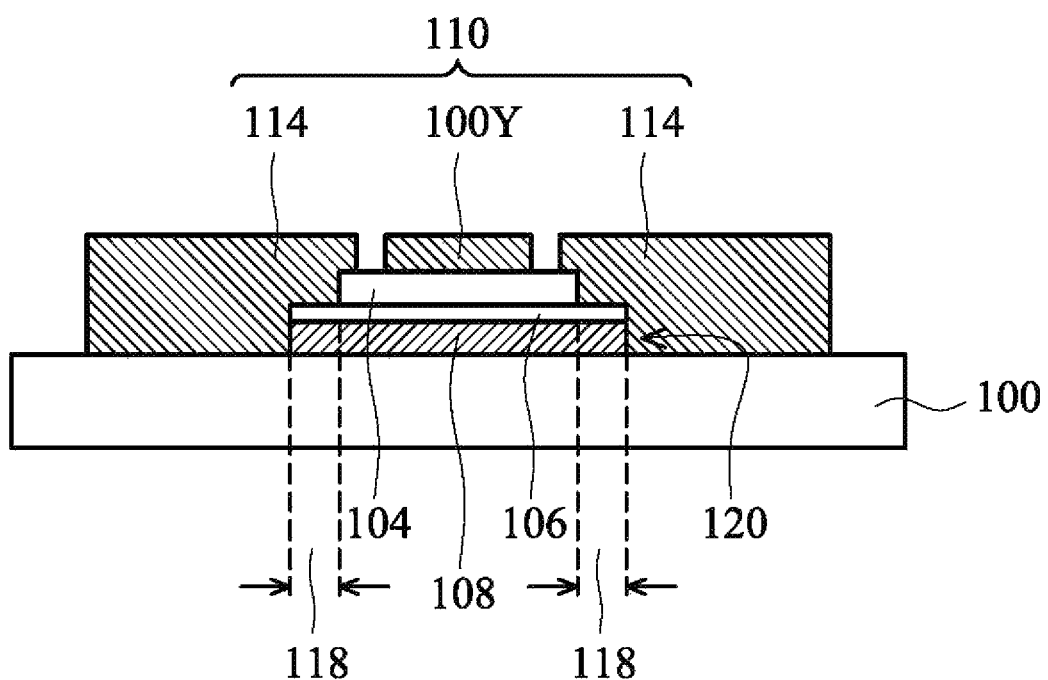
Figure 10:
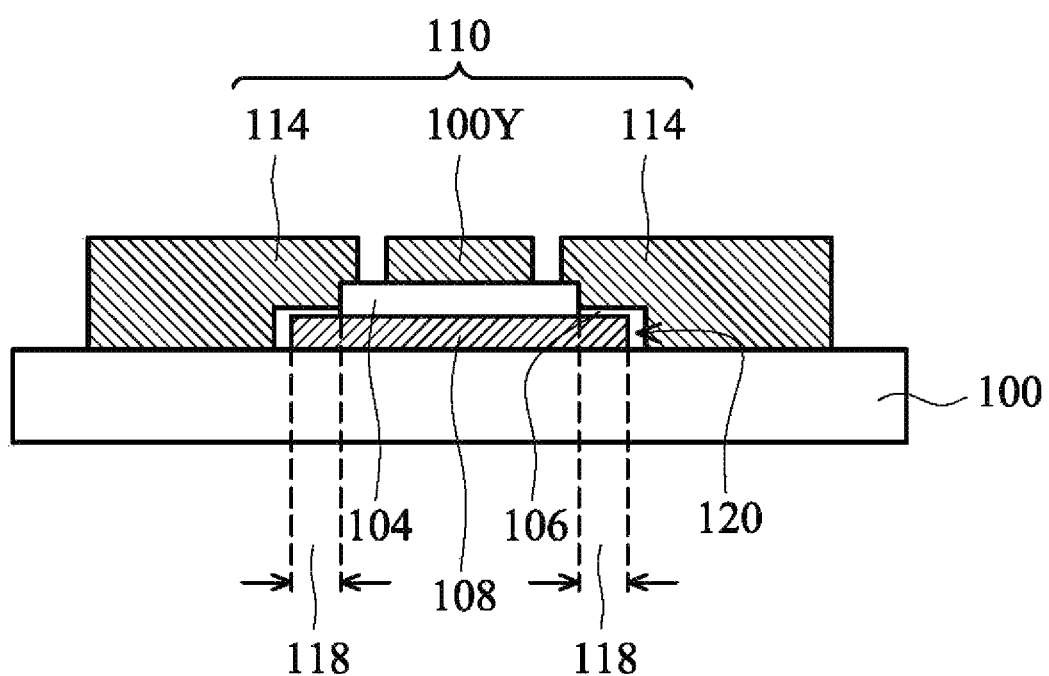
Figure 12:
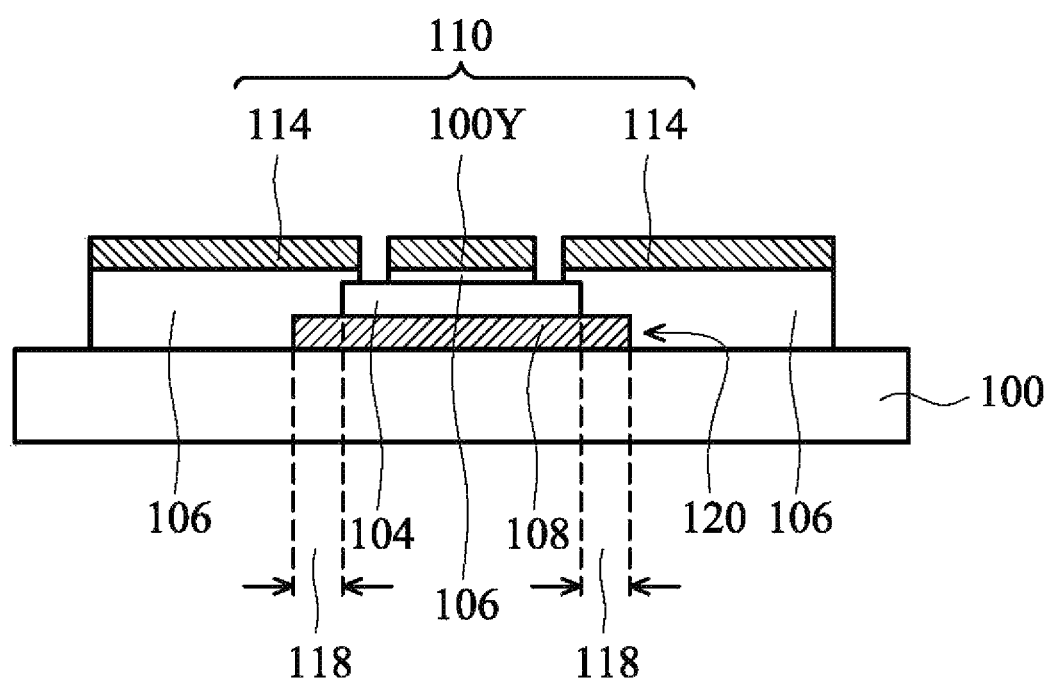

In embodiments of touch-sensor structures of FIGS. 8, 10 and 12, the touch-sensor structures further comprise a substrate 100. The substrate 100 can be used as a carrier. Moreover, the substrate 100 can be used as a cover plate of a touch panel, which can be a strengthening glass substrate or a plastic substrate. The second conductive layer 120 is formed on the substrate 100. In addition, the material of the second conductive layer 120 can be a crystalline indium tin oxide and the material of the first conductive layer 110 can be a non-crystalline indium tin oxide.

Referring to FIG. 8, a cross section of a touch-sensor structure according to an embodiment of the disclosure is shown.

The second conductive layer 120 includes the bridge lines 108 as shown in FIG. 1. The connections and the functions of the bridge lines 108 are described above, and are not repeated again.

The connections and the functions of the intermediate conductive layer 106 can be illustrated in the description of FIG. 1. In some embodiments, the intermediate conductive layer 106 is disposed between each of the insulating isolation portions 104 and each of the bridge lines 108, which correspond with each other. The intermediate conductive layer 106 has a pattern corresponding to or the same as the pattern of the bridge lines 108.

The connections and the functions of the insulating isolation portions 104 can also be illustrated in the description of FIG. 1. In some embodiments, the insulating isolation portions 104 are disposed on the intermediate conductive layer 106 which is disposed between each of the connection lines 116 and each of the bridge lines 108.

The first conductive layer 110 includes the first conductive units 112 and the connection lines 116 which constitute the first axial electrodes 100Y, and the second conductive units 114 of the second axial electrodes 100X as shown in FIG. 1. In some embodiments, a portion of the first conductive layer 110, such as the first conductive units 112 and the second conductive units 114, is disposed on the substrate 100. Another portion of the first conductive layer 110, such as the connection lines 116, is not disposed on the substrate 100, but is disposed on the insulating isolation portions 104. Other details of the structure and the connection of the first conductive layer 110 can be referred to the description of FIG. 1.

In addition, the connections and the functions of each element, and the material and the method of forming each element can also be illustrated in the description of FIG. 1, and are not repeated again herein.

Figure 9A:
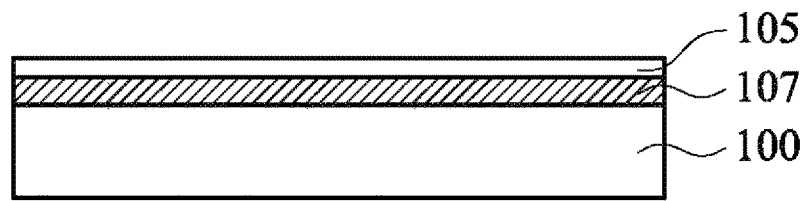
FIGS. 9A-9D show illustrative cross sections of intermediate stages of forming the touch-sensor structure of FIG. 8 according to an embodiment of the invention.

Referring to FIGS. 9A-9D, which shows cross sections of intermediate stages of forming the touch-sensor structure of FIG. 8 according to an embodiment of the disclosure. As shown in FIG. 9A, firstly, a second conductive material layer 107 is formed on the substrate 100. The material of the second conductive material layer 107 is a crystalline indium tin oxide. In some embodiments, the second conductive material layer 107 is formed by, but without limitation to, a deposition process. Next, an intermediate conductive material layer 105 is formed to completely cover the second conductive material layer 107. The second conductive material layer 107 includes the subsequently patterned second conductive layer 120, thus the intermediate conductive material layer 105 completely covers the second conductive layer 120 herein. The material of the intermediate conductive material layer 105 is recited as above and is not repeated herein. In some embodiments, the intermediate conductive material layer 105 is formed by, but without limitation to, deposition processes.

Figure 9B:
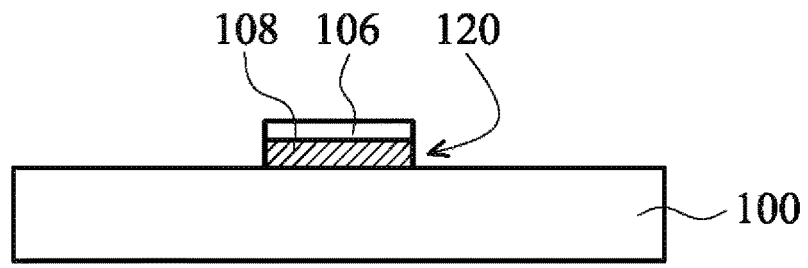

As shown in FIG. 9B, the steps for patterning the second conductive material layer 107 and the intermediate conductive material layer 105 can be performed together by a photolithography and etching process in the same step for forming the bridge lines 108 of the second conductive layer 120 and the intermediate conductive layer 106. The structures and the connections of the formed second conductive layer 120 and the intermediate conductive layer 106 can be illustrated in the description of FIG. 8. Thus, the intermediate conductive layer 106 has a pattern corresponding to or the same as the pattern of the bridge lines 108. In some embodiments, the steps for patterning the second conductive material layer 107 and the intermediate conductive material layer 105 are completed by, but without limitation to, a photolithography and etching process. In other embodiments, the second conductive layer 120 and the intermediate conductive layer 106 can be formed in separated steps. Firstly, the patterned second conductive layer 120 is formed, and then the intermediate conductive material layer 105 is formed on the second conductive layer 120. Next, the intermediate conductive material layer 105 is patterned to form the intermediate conductive layer 106. The formed intermediate conductive layer 106 has a pattern corresponding to or the same as the pattern of the second conductive layer 120.

Figure 9C:
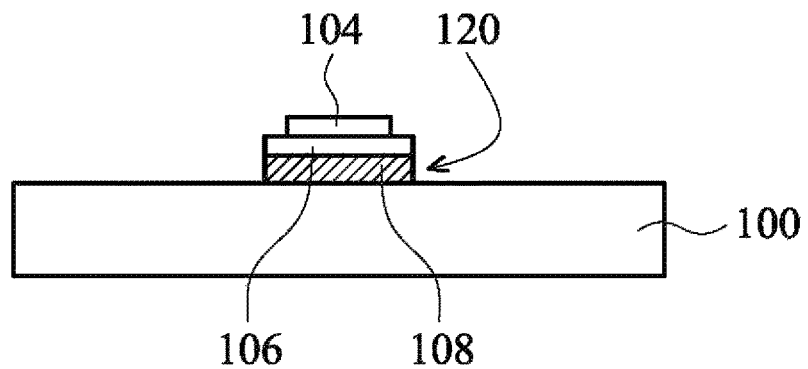

As shown in FIG. 9C, the insulating isolation portions 104 as described in FIG. 8 are formed on the intermediate conductive layer 106. The insulating isolation portions 104 can be formed by a coating, photolithography and etching process, or by a printing process.

Figure 9D:
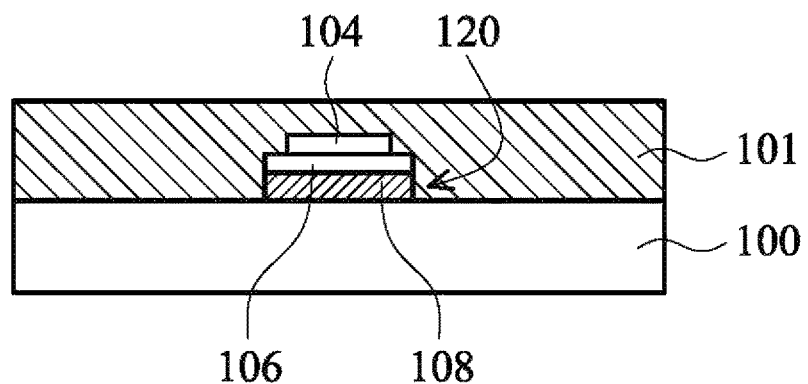

As shown in FIG. 9D, after the insulating isolation portions 104 are formed, a first conductive material layer 101 is formed. The material of the first conductive material layer 101 is a non-crystalline indium tin oxide. In some embodiments, the first conductive material layer 101 is deposited by, but without limitation to, a low-temperature deposition process. In some embodiments, the first conductive material layer 101 is patterned by, but without limitation to, a photolithography and etching process to form the pattern of the first conductive layer 110 as shown in FIG. 8. The etching process described above can be performed by using an oxalic acid solution. Then, the main structure of the touch-sensor structure of FIG. 8 is completed.

In some embodiments, before the insulating isolation portions 104 are formed, the formed intermediate conductive material layer 105 or the subsequently patterned intermediate conductive layer 106 is enough to isolate the second conductive layer 120 from the subsequently formed first conductive layer 110 without a large area of direct contact between the first and second conductive layers 110 and 120. Thus, it can prevent or reduce crystallization produced between the second conductive layer 120 and the subsequently formed first conductive layer 110.

Referring to FIG. 10, a cross section of a touch-sensor structure according to an embodiment of the disclosure is shown.

The second conductive layer 120 includes the bridge lines 108 as shown in FIG. 1. The connections and the functions of the bridge lines 108 are described above, and are not repeated again.

The connections and the functions of the intermediate conductive layer 106 can be illustrated in the description of FIG. 1. In some embodiments, the intermediate conductive layer 106 is disposed at overlapping positions 118 between each of the bridge lines 108 and the second conductive units 114. Moreover, the intermediate conductive layer 106 wraps the outer sides of the bridge lines 108.

The connections and the functions of the insulating isolation portions 104 can also be illustrated in the description of FIG. 1. In some embodiments, the insulating isolation portions 104 are disposed on each of the bridge lines 108. Thus, the region in which the intermediate conductive layer 106 wraps the bridge lines 108 is the outer edges of the bridge lines 108 that are outside of the insulating isolation portions 104.

The first conductive layer 110 includes the first conductive units 112 and the connection lines 116 which constitute the first axial electrodes 100Y, and the second conductive units 114 of the second axial electrodes 100X as shown in FIG. 1. In some embodiments, a portion of the first conductive layer 110, such as the first conductive units 112 and the second conductive units 114, is disposed on the substrate 100 and completely isolated from the second conductive layer 120. The portion of the first conductive layer 110 is electrically connected with the second conductive layer 120. Another portion of the first conductive layer 110 not disposed on the substrate 100, such as the connection lines 116, is disposed on the insulating isolation portions 104. Other details of the structure and the connection of the first conductive layer 110 can be illustrated in the description of FIG. 1.

In addition, the connections and the functions of each element, and the material and the method of forming each element can also be illustrated in the description of FIG. 1, and are not repeated again herein.

Figure 11A:
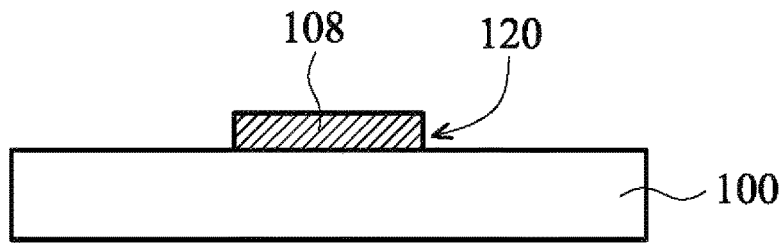
FIGS. 11A-11D show illustrative cross sections of intermediate stages of forming the touch-sensor structure of FIG. 10 according to an embodiment of the invention.

Referring to FIGS. 11A-11D, which shows cross sections of intermediate stages of forming the touch-sensor structure of FIG. 10 according to an embodiment of the disclosure. As shown in FIG. 11A, the bridge lines 108 of the second conductive layer 120 can be formed on the substrate 100 by a deposition, photolithography and etching process. The material of the second conductive layer 120 is a crystalline indium tin oxide. A second conductive material layer is firstly deposited on the substrate 100 and then the second conductive material layer is patterned by a photolithography and etching process to form the second conductive layer 120. The pattern of the second conductive layer 120 can also be formed by other methods in one step, for example by a printing process.

Figure 11B:
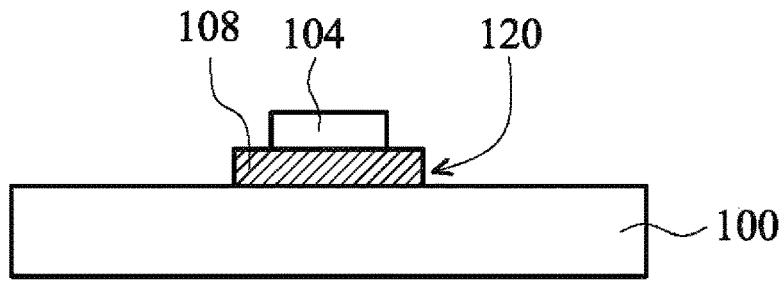

As shown in FIG. 11B, the insulating isolation portions 104 as described in FIG. 10 are formed on the bridge lines 108 of the second conductive layer 120. The insulating isolation portions 104 can be formed by a coating, photolithography and etching process, or by a printing process.

Figure 11C:
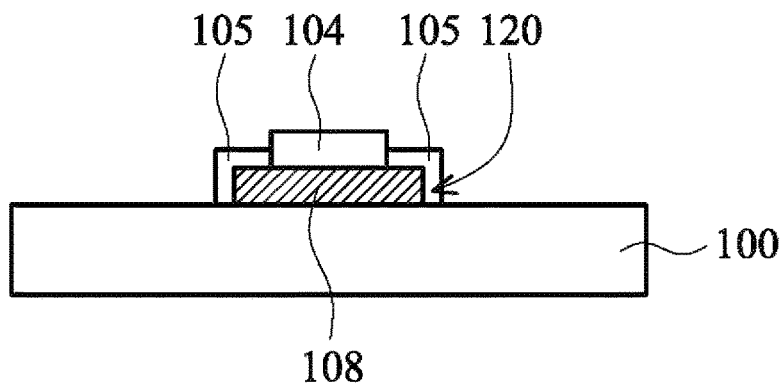

As shown in FIG. 11C, after the insulating isolation portions 104 are formed, in some embodiments, an intermediate conductive material layer 105 is formed by, a deposition process to cover a portion of the second conductive layer 120, but without limitation to that. The material of the intermediate conductive material layer 105 is the same as in the above description and is not repeated again herein to simplify the description. In some embodiments, the intermediate conductive material layer 105 is patterned by, but without limitation to, a photolithography and etching process to form the intermediate conductive layer 106 as shown in FIG. 10. In some embodiments, the intermediate conductive layer 106 is located at the overlapping positions between the bridge lines 108 and the subsequently formed second conductive units 114 of the first conductive layer 110. Moreover, the intermediate conductive layer 106 wraps the outer sides of the bridge lines 108. In some embodiments, the areas of forming the intermediate conductive material layer 105 and the insulating isolation portions 104 are enough to isolate the second conductive layer 120 from the subsequently formed first conductive layer 110 without coming into direct contact therebetween.

Figure 11D:
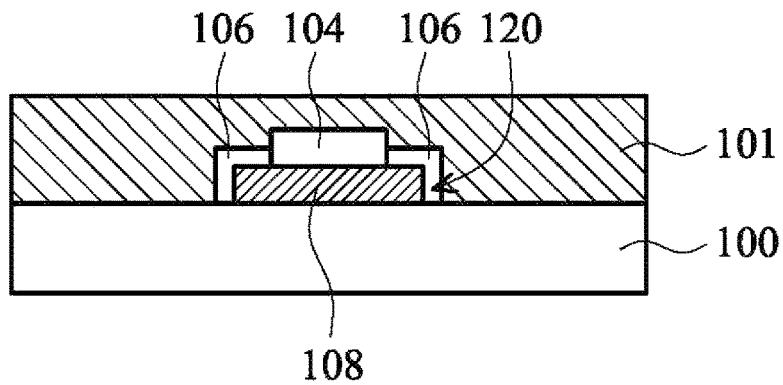

As shown in FIG. 11D, after the insulating isolation portions 104 are formed, a first conductive material layer 101 is formed. The material of the first conductive material layer 101 is a non-crystalline indium tin oxide. In some embodiments, the first conductive material layer 101 is deposited by, but without limitation to, a low-temperature deposition process. In some embodiments, the first conductive material layer 101 is patterned by, a photolithography and etching process to form the pattern of the first conductive layer 110 as shown in FIG. 10, but without limitation to that. The etching process described above can be performed by using an oxalic acid solution. Then, the main structure of the touch-sensor structure of FIG. 10 is completed.

Referring to FIG. 12, a cross section of a touch-sensor structure according to an embodiment of the disclosure is shown.

The second conductive layer 120 includes the bridge lines 108 as shown in FIG. 1. The connections and the functions of the bridge lines 108 are described above, and are not repeated again.

The connections and the functions of the intermediate conductive layer 106 can be illustrated in the description of FIG. 1. In some embodiments, the intermediate conductive layer 106 is further disposed between each of the connection lines 116 and each of the insulating isolation portions 104, which correspond with each other. Moreover, the intermediate conductive layer 106 is disposed between the first conductive units 112 and the substrate 100, and between the second conductive units 114 and the substrate 100. The intermediate conductive layer 106 has a pattern corresponding to or the same as the pattern of the first conductive units 112, the connection lines 116 and the second conductive units 114.

Figure 13A:
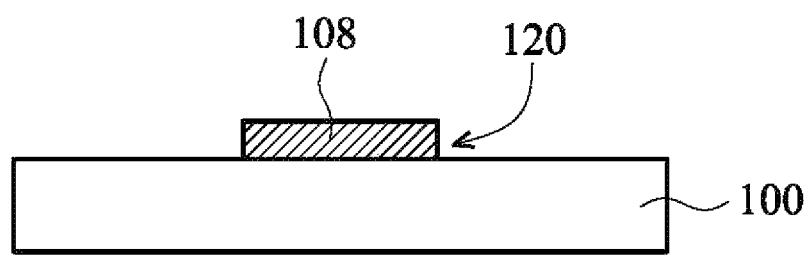
FIGS. 13A-13C show illustrative cross sections of intermediate stages of forming the touch-sensor structure of FIG. 12 according to an embodiment of the invention.
Figure 13B:
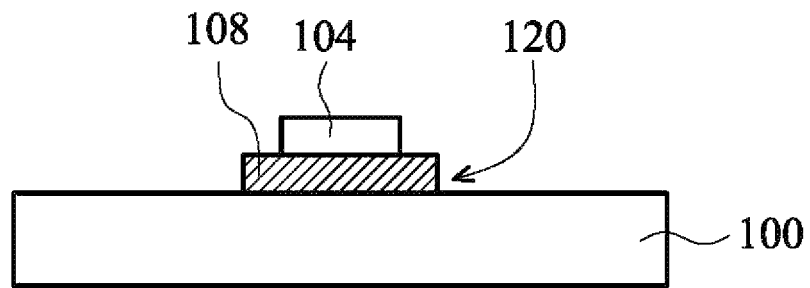
Figure 13C:
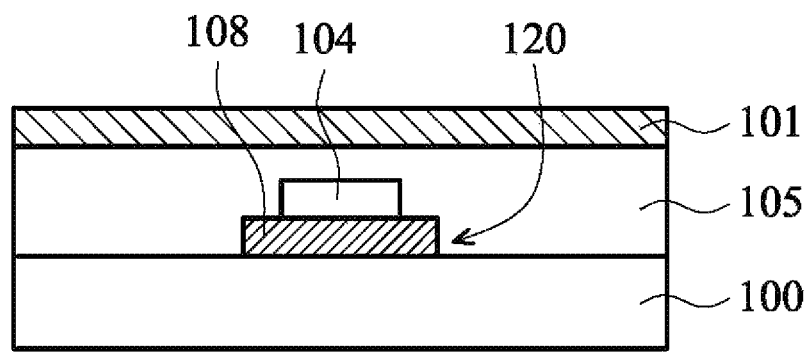

Referring to FIGS. 13A-13C, which shows cross sections of intermediate stages of forming the touch-sensor structure of FIG. 12 according to an embodiment of the disclosure. As shown in FIG. 13A, in some embodiments, the bridge lines 108 of the second conductive layer 120 is formed on the substrate 100 by, but without limitation to, a deposition, photolithography and etching process. The material of the second conductive layer 120 is a crystalline indium tin oxide. A second conductive material layer is firstly deposited on the substrate 100 and then the second conductive material layer is patterned by a photolithography and etching process to form the second conductive layer 120. The pattern of the second conductive layer 120 can also be formed by other methods in one step, for example by a printing process.

As shown in FIG. 13B, the insulating isolation portions 104 as described in FIG. 12 are formed on the bridge lines 108 of the second conductive layer 120. The insulating isolation portions 104 can be formed by a coating, photolithography and etching process, or by a printing process.

As shown in FIG. 13C, after the insulating isolation portions 104 are formed, in some embodiments, an intermediate conductive material layer 105 is formed by, but without limitation to, a deposition process. The material of the intermediate conductive material layer 105 is the same as in the above description and is not repeated again herein. The area of the intermediate conductive material layer 105 at least can completely cover the second conductive layer 120. In some embodiments, the area of the intermediate conductive material layer 105 further completely covers the insulating isolation portions 104 and a portion of the substrate 100. Next, a first conductive material layer 101 is formed on the intermediate conductive material layer 105. The material of the first conductive material layer 101 is a non-crystalline indium tin oxide. In some embodiments, the first conductive material layer 101 is deposited by, but without limitation to, a low-temperature deposition process. The intermediate conductive material layer 105 is enough to isolate the second conductive layer 120 from the subsequently formed first conductive layer 110 without coming into direct contact therebetween. Thus, the intermediate conductive material layer 105 can prevent the second conductive layer 120 from being affected by the first conductive layer 110 and crystallization in the second conductive layer 120 is thereby prevented. Thus, a poor etching issue of the second conductive layer 120 is prevented.

In some embodiments, the steps for patterning the first conductive material layer 101 and the intermediate conductive material layer 105 are performed by, but without limitation to, a photolithography and etching process, and in the same step or separated steps for forming the patterns of the first conductive layer 110 and the intermediate conductive layer 106 as shown in FIG. 12, respectively. As a result, the intermediate conductive layer 106 has a pattern corresponding to or the same as the pattern of the first conductive units 112, the connection lines 116 and the second conductive units 114 as shown in FIG. 12. Moreover, the intermediate conductive layer 106 is formed at the above mentioned overlapping positions 118. In addition, the intermediate conductive layer 106 is further formed between each of the connection lines 116 and each of the insulating isolation portions 104, which correspond with each other. Moreover, the intermediate conductive layer 106 is formed between the first conductive units 112 and the substrate 100, and between the second conductive units 114 and the substrate 100. The etching process described above can be performed by using an oxalic acid solution to form the first conductive layer 110 and the intermediate conductive layer 106. Then, the main structure of the touch-sensor structure of FIG. 12 is completed.

In summary, according to the embodiments of the disclosure, in the intermediate stages of forming the touch-sensor structures and in the completed touch-sensor structures, the intermediate conductive material layer 105 or the intermediate conductive layer 106 can isolate the non-crystalline indium tin oxide (the first conductive layer 110 or the second conductive layer 120) from the crystalline indium tin oxide (the second conductive layer 120 or the first conductive layer 110) without coming into direct contact (of a large area) therebetween. The material of the intermediate conductive material layer 105 or the intermediate conductive layer 106 is different from the material of the second conductive layer 120 and/or the first conductive layer 110. Thus, in the whole fabrication process, the non-crystalline indium tin oxide (the first conductive layer 110 or the second conductive layer 120) is not affected (or it is less affected) by the crystalline indium tin oxide (the second conductive layer 120 or the first conductive layer 110). The embodiments of the disclosure can prevent the non-crystalline indium tin oxide (the first conductive layer 110 or the second conductive layer 120) from crystallization and poor etching of the non-crystalline indium tin oxide is thereby prevented. As a result, the embodiments of the disclosure can prevent the touch-sensor structures from short-circuiting that is produced by a residue of the etching process of the non-crystalline indium tin oxide. Therefore, the embodiments of the disclosure can ensure the touch-sensing function of the touch-sensor structures and enhance the production yield of the touch panels.

While the disclosure has been described by way of example and in terms of certain embodiments, it is to be understood that the disclosure is not limited to the disclosed embodiments. The disclosure is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a touch-sensor structure, comprising:
    forming a first conductive layer, wherein:
        the first conductive layer includes a plurality of first conductive units arranged along a first axis, a plurality of connection lines, and a plurality of second conductive units arranged along a second axis,
        the second conductive units are correspondingly disposed at two opposite sides of each connection line of the connection lines,
        two ends of each connection line are connected to two adjacent first conductive units, and
        a material of the first conductive layer is a crystalline indium tin oxide;
    forming a second conductive layer, wherein:
        the second conductive layer includes a plurality of bridge lines,
        two ends of each bridge line are respectively electrically connected to the second conductive units disposed at the two opposite sides of each connection line, and
        a material of the second conductive layer is a non-crystalline indium tin oxide;
    forming a plurality of insulating isolation portions, wherein the insulating isolation portions are respectively disposed between each of the connection lines and each of the bridge lines, which correspond with each other, for insulating the first conductive units from the second conductive units;
    before forming the insulating isolation portions, forming an intermediate conductive material layer to completely cover the first conductive layer or the second conductive layer for isolating the first conductive layer from the second conductive layer so that the first conductive layer is not in direct contact with the second conductive layer; and patterning the intermediate conductive material layer to form an intermediate conductive layer, wherein:

the intermediate conductive layer is at least located in overlapping positions between the bridge lines and the second conductive units, and the intermediate conductive layer has a conductivity and electrically connects each of the bridge lines with a corresponding second conductive unit of the second conductive units.

2. The method of claim 1, wherein:

the first conductive layer is directly formed on a substrate, and the intermediate conductive material layer covers the first conductive layer.

3. The method of claim 1, wherein:

the second conductive layer is directly formed on a substrate, and the intermediate conductive material layer covers the second conductive layer.

4. A method of forming a touch-sensor structure, comprising:

forming a first conductive layer, wherein:

the first conductive layer includes a plurality of first conductive units arranged along a first axis, a plurality of connection lines, and a plurality of second conductive units arranged along a second axis, the second conductive units are correspondingly disposed at two opposite sides of each connection line of the connection lines, two ends of each connection line are connected to two adjacent first conductive units, and a material of the first conductive layer is a crystalline indium tin oxide;

forming a second conductive layer, wherein:

the second conductive layer includes a plurality of bridge lines, two ends of each bridge line are respectively electrically connected to the second conductive units disposed at the two opposite sides of each connection line, and a material of the second conductive layer is a non-crystalline indium tin oxide;

forming a plurality of insulating isolation portions, wherein the insulating isolation portions are respectively disposed between each of the connection lines and each of the bridge lines, which correspond with each other, for insulating the first conductive units from the second conductive units;

after forming the insulating isolation portions, forming an intermediate conductive material layer to partially cover the first conductive layer or the second conductive layer, wherein the intermediate conductive material layer and the insulating isolation portions are for isolating the first conductive layer from the second conductive layer so that the first conductive layer is not in direct contact with the second conductive layer; and patterning the intermediate conductive material layer to form an intermediate conductive layer, wherein:

the intermediate conductive layer is at least located in overlapping positions between the bridge lines and the second conductive units, and the intermediate conductive layer has a conductivity and electrically connects each of the bridge lines with a corresponding second conductive unit of the second conductive units.

5. The method of claim 4, wherein:

the first conductive layer is directly formed on a substrate, the intermediate conductive material layer partially covers the first conductive layer, the step of forming the second conductive layer comprises patterning a second conductive material layer to form the second conductive layer, and the step of patterning the second conductive material layer is performed concurrently with the step of patterning the intermediate conductive material layer.

6. The method of claim 4, wherein:

the second conductive layer is directly formed on a substrate, the intermediate conductive material layer partially covers the second conductive layer, the step of forming the first conductive layer comprises patterning a first conductive material layer to form the first conductive layer, and the step of patterning the first conductive material layer is performed concurrently with the step of patterning the intermediate conductive material layer.

7. The method of claim 4, wherein a material of the intermediate conductive layer is different than the material of the first conductive layer and different than the material of the second conductive layer.

8. The method of claim 1, wherein a material of the intermediate conductive layer is different than the material of the first conductive layer and different than the material of the second conductive layer.

9. A method of forming a touch-sensor structure, comprising:

forming a first conductive layer, wherein:

the first conductive layer includes a plurality of first conductive units arranged along a first axis, a plurality of connection lines, and a plurality of second conductive units arranged along a second axis, the second conductive units are correspondingly disposed at two opposite sides of each connection line of the connection lines, two ends of each connection line are connected to two adjacent first conductive units, and a material of the first conductive layer is a non-crystalline indium tin oxide;

forming a second conductive layer, wherein:

the second conductive layer includes a plurality of bridge lines, two ends of each bridge line are respectively electrically connected to the second conductive units disposed at the two opposite sides of each connection line, and a material of the second conductive layer is a crystalline indium tin oxide;

forming a plurality of insulating isolation portions, wherein the insulating isolation portions are respectively disposed between each of the connection lines and each of the bridge lines, which correspond with each other, for insulating the first conductive units from the second conductive units;

before forming the insulating isolation portions, forming an intermediate conductive material layer to completely cover the first conductive layer or the second conductive layer for isolating the first conductive layer from the second conductive layer so that the first conductive layer is not in direct contact with the second conductive layer; and patterning the intermediate conductive material layer to form an intermediate conductive layer, wherein:

the intermediate conductive layer is at least located in overlapping positions between the bridge lines and the second conductive units, and the intermediate conductive layer has a conductivity and electrically connects each of the bridge lines with a corresponding second conductive unit of the second conductive units.

10. The method of claim 9, wherein:

the first conductive layer is directly formed on a substrate, and the intermediate conductive material layer covers the first conductive layer.

11. The method of claim 9, wherein:

the second conductive layer is directly formed on a substrate, and the intermediate conductive material layer covers the second conductive layer.

12. The method of claim 9, wherein a material of the intermediate conductive layer is different than the material of the first conductive layer and different than the material of the second conductive layer.

13. A method of forming a touch-sensor structure, comprising:

forming a first conductive layer, wherein:
  the first conductive layer includes a plurality of first conductive units arranged along a first axis, a plurality of connection lines, and a plurality of second conductive units arranged along a second axis,
  the second conductive units are correspondingly disposed at two opposite sides of each connection line of the connection lines,
  two ends of each connection line are connected to two adjacent first conductive units, and
  a material of the first conductive layer is a non-crystalline indium tin oxide; forming a second conductive layer, wherein:
  the second conductive layer includes a plurality of bridge lines,
  two ends of each bridge line are respectively electrically connected to the second conductive units disposed at the two opposite sides of each connection line, and
  a material of the second conductive layer is a crystalline indium tin oxide;

forming a plurality of insulating isolation portions, wherein the insulating isolation portions are respectively disposed between each of the connection lines and each of the bridge lines, which correspond with each other, for insulating the first conductive units from the second conductive units;

after forming the insulating isolation portions, forming an intermediate conductive material layer to partially cover the first conductive layer or the second conductive layer, wherein the intermediate conductive material layer and the insulating isolation portions are for isolating the first conductive layer from the second conductive layer so that the first conductive layer is not in direct contact with the second conductive layer; and patterning the intermediate conductive material layer to form an intermediate conductive layer, wherein:
  the intermediate conductive layer is at least located in overlapping positions between the bridge lines and the second conductive units, and
  the intermediate conductive layer has a conductivity and electrically connects each of the bridge lines with a corresponding second conductive unit of the second conductive units.

14. The method of claim 13, wherein:

the first conductive layer is directly formed on a substrate, and the intermediate conductive material layer partially covers the first conductive layer.

15. The method of claim 14, wherein:

the step of forming the second conductive layer comprises patterning a second conductive material layer to form the second conductive layer, and the step of patterning the second conductive material layer is performed concurrently with the step of patterning the intermediate conductive material layer.

16. The method of claim 13, wherein:

the step of forming the second conductive layer comprises patterning a second conductive material layer to form the second conductive layer, and the step of patterning the second conductive material layer is performed concurrently with the step of patterning the intermediate conductive material layer.

17. The method of claim 13, wherein:

the second conductive layer is directly formed on a substrate, and the intermediate conductive material layer partially covers the second conductive layer.

18. The method of claim 17, wherein:

the step of forming the first conductive layer comprises patterning a first conductive material layer to form the first conductive layer, and the step of patterning the first conductive material layer is performed concurrently with the step of patterning the intermediate conductive material layer.

19. The method of claim 13, wherein:

the step of forming the first conductive layer comprises patterning a first conductive material layer to form the first conductive layer, and the step of patterning the first conductive material layer is performed concurrently with the step of patterning the intermediate conductive material layer.

20. The method of claim 13, wherein a material of the intermediate conductive layer is different than the material of the first conductive layer and different than the material of the second conductive layer.

* * * * *